United States Patent
Wang et al.

(10) Patent No.: US 10,558,075 B2
(45) Date of Patent: Feb. 11, 2020

(54) COLOR FILTER SUBSTRATE, DISPLAY PANEL AND METHOD OF MANUFACTURING COLOR FILTER SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Tianhong Wang, Guangdong (CN); Shujhih Chen, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 247 days.

(21) Appl. No.: 15/744,750

(22) PCT Filed: Dec. 19, 2017

(86) PCT No.: PCT/CN2017/117304
§ 371 (c)(1),
(2) Date: Jan. 12, 2018

(87) PCT Pub. No.: WO2019/100485
PCT Pub. Date: May 31, 2019

(65) Prior Publication Data
US 2019/0155093 A1    May 23, 2019

(30) Foreign Application Priority Data
Nov. 22, 2017   (CN) .......................... 2017 1 1176479

(51) Int. Cl.
*G02F 1/1335*   (2006.01)
*G02F 1/1339*   (2006.01)
(Continued)

(52) U.S. Cl.
CPC ...... *G02F 1/133516* (2013.01); *G02F 1/1339* (2013.01); *G02F 1/133512* (2013.01); *G03F 7/0007* (2013.01); *G02F 2001/136222* (2013.01)

(58) Field of Classification Search
CPC ............. G03F 7/0007; G02F 1/133512; G02F 1/133514; G02F 1/133516; G02F 2001/136222
(Continued)

(56) References Cited

U.S. PATENT DOCUMENTS

2011/0222013 A1* 9/2011 Kawanishi ............ G02F 1/1339
                                                    349/153
2014/0063431 A1* 3/2014 Shih ...................... G02F 1/1339
                                                    349/153
(Continued)

FOREIGN PATENT DOCUMENTS

CN        102789089        11/2012
CN        104865754        8/2015
(Continued)

*Primary Examiner* — John A McPherson
(74) *Attorney, Agent, or Firm* — Hemisphere Law, PLLC; Zhigang Ma

(57) ABSTRACT

A color filter substrate, a display panel and a method of manufacturing color filter substrate are provided. The color filter substrate comprising a first glass substrate and a blocking wall formed on a surface of the first glass substrate which is toward to an array substrate, the blocking wall is a projection structure of the surface of the first glass substrate, and the blocking wall is located in a non-display region. The invention further provides correspondingly display panel and method of manufacturing color filter substrate. The
(Continued)

color filter substrate, display panel and method of manufacturing color filter substrate of this disclosure, which using the glass substrate on CF side to be aligning film blocking wall. It could control boundary of the aligning film on CF side, and prevent water vapor pass into inside panel of the aligning film on CF side caused circuit corrosion.

10 Claims, 2 Drawing Sheets

(51) Int. Cl.
  *G03F 7/00* (2006.01)
  *G02F 1/1362* (2006.01)
(58) Field of Classification Search
  USPC .......... 430/7, 313, 317, 323; 216/11, 23, 41, 216/49; 359/153, 156, 160
  See application file for complete search history.

(56) References Cited

U.S. PATENT DOCUMENTS

| | | | |
|---|---|---|---|
| 2015/0085240 A1* | 3/2015 | Xing | G02F 1/1333 349/153 |
| 2016/0238866 A1 | 8/2016 | Yamaguchi | |
| 2017/0052397 A1* | 2/2017 | Kim | G02F 1/133707 |
| 2017/0110477 A1* | 4/2017 | Han | H05K 999/99 |

FOREIGN PATENT DOCUMENTS

| | | |
|---|---|---|
| CN | 105093705 | 11/2015 |
| CN | 206601549 | 10/2017 |
| JP | 2005181795 | 7/2005 |

* cited by examiner

COLOR FILTER SUBSTRATE, DISPLAY PANEL AND METHOD OF MANUFACTURING COLOR FILTER SUBSTRATE

RELATED APPLICATIONS

The present application is a National Phase of International Application Number PCT/CN2017/117304, filed on Dec. 19, 2017, and claims the priority of China Application 201711176479.4, filed on Nov. 22, 2017.

FIELD OF THE DISCLOSURE

The disclosure relates to a liquid crystal display technical field, and more particularly to a color filter substrate, a display panel and a method of manufacturing color filter substrate.

BACKGROUND

Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

In the active matrix liquid crystal display, each pixel has a thin film transistor (TFT). The gate thereof is connected to the horizontal scanning line, the source thereof is connected to the data line in the vertical direction, and the drain thereof is connected to the pixel electrode. Applying enough voltage on the horizontal scanning line will turn on all TFTs on this line. At this time, the pixel electrodes on the horizontal scanning line will be connected with the data lines in the vertical direction, then write the display signal on the data lines into pixel, and control various liquid crystal transmittances to control the color.

Generally, the liquid crystal display panel comprises a CF (Color Filter) substrate, a TFT (Thin Film Transistor) substrate, LC (Liquid Crystal) sandwiched between the CF substrate and TFT substrate and sealant. The formation process generally comprises: a forepart Array process (thin film, photo, etching and stripping), a middle Cell process (Lamination of the TFT substrate and the CF substrate) and a post module assembly process (Attachment of the driving IC and the printed circuit board). The forepart Array process is mainly to form the TFT substrate for controlling the movement of the liquid crystal molecules; the middle Cell process is mainly to add liquid crystal between the TFT substrate and the CF substrate; the post module assembly process is mainly the driving IC attachment and the integration of the printed circuit board. Thus, the liquid crystal molecules are driven to rotate and display pictures.

With the curving panel market be increased, the widely use the COA (Color filter On Array) and POA (Photo Spacer On Array) process, and preparing the RGB filter and the photo spacer on the array substrate could effective avoid color shift at large viewing angle and risk of the light leakage.

However, if using the COA and POA process, PI (polyimide) aligning film of the CF substrate cannot control accuracy coating while made the PI aligning film by the inject process. In order to avoid the unevenness of the image display caused by the unevenness PI films, the PI aligning film of the CF substrate will be coated over the sealant usually, and entirely covering CF substrate. It cause the water vapor easily enter to inside the panel by PI aligning film on the CF substrate, and cause life time of inside elements of the panel be shortened or inner circuit of the panel corrosion, cause abnormal panel display.

SUMMARY

Furthermore, the disclosure provides a color filter substrate for controlling boundary of aligning film on CF side.

The purpose of the disclosure provides a display panel for controlling boundary of aligning film on CF side.

Another purpose of the disclosure provides a method of manufacturing the color filter substrate for manufacturing a color filter substrate which could control boundary of aligning film of CF side.

An objective of the disclosure is achieved by following embodiments. In particular, a color filter substrate, comprising a first glass substrate and a blocking wall formed on a surface of the first glass substrate which is toward to an array substrate, the blocking wall is a projection structure of the surface of the first glass substrate, and the blocking wall is located in a non-display region In an embodiment, the blocking wall comprises a first blocking wall and a second blocking wall are interval positioned.

In an embodiment, the first blocking wall and the second blocking wall are respectively enclosed around central of the first glass substrate.

In an embodiment, the first blocking wall and the second blocking wall are rectangular.

According to another aspect of the disclosure, the disclosure further provides a display panel. The display panel comprising a color filter substrate and an array substrate, the color filter substrate comprising a first glass substrate and a blocking wall formed on a surface of the first glass substrate which is toward to the array substrate, the blocking wall is a projection structure of the surface of the first glass substrate, and the blocking wall is located in a non-display region, the display panel is manufactured by color filter on the display panel.

According to another aspect of the disclosure, the disclosure further provides a method of manufacturing color filter substrate, comprising step 1, providing a first glass substrate;

step 2, coating a shielding layer on the first glass substrate;

step 3, etching the first glass substrate by etching solution, and etching the first glass substrate without shielded by the shielding layer, obtaining a blocking wall; and step 4, removing the shielding layer.

In an embodiment, the shielding layer is sealant.

In an embodiment, the shielding layer comprising a first shielding layer and a second shielding layer are interval positioned, the blocking wall comprising a first blocking wall and a second blocking wall.

In an embodiment, the first blocking wall and the second blocking wall are respectively enclosed around central of the first glass substrate.

In an embodiment, etching solution is hydrofluoric acid.

In sum, the color filter substrate, display panel and method of manufacturing color filter substrate of this disclosure, which using the glass substrate on CF side to be aligning film blocking wall. It could control boundary of the aligning film on CF side, and prevent water vapor pass into the inside panel of the aligning film on CF side caused circuit corrosion.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
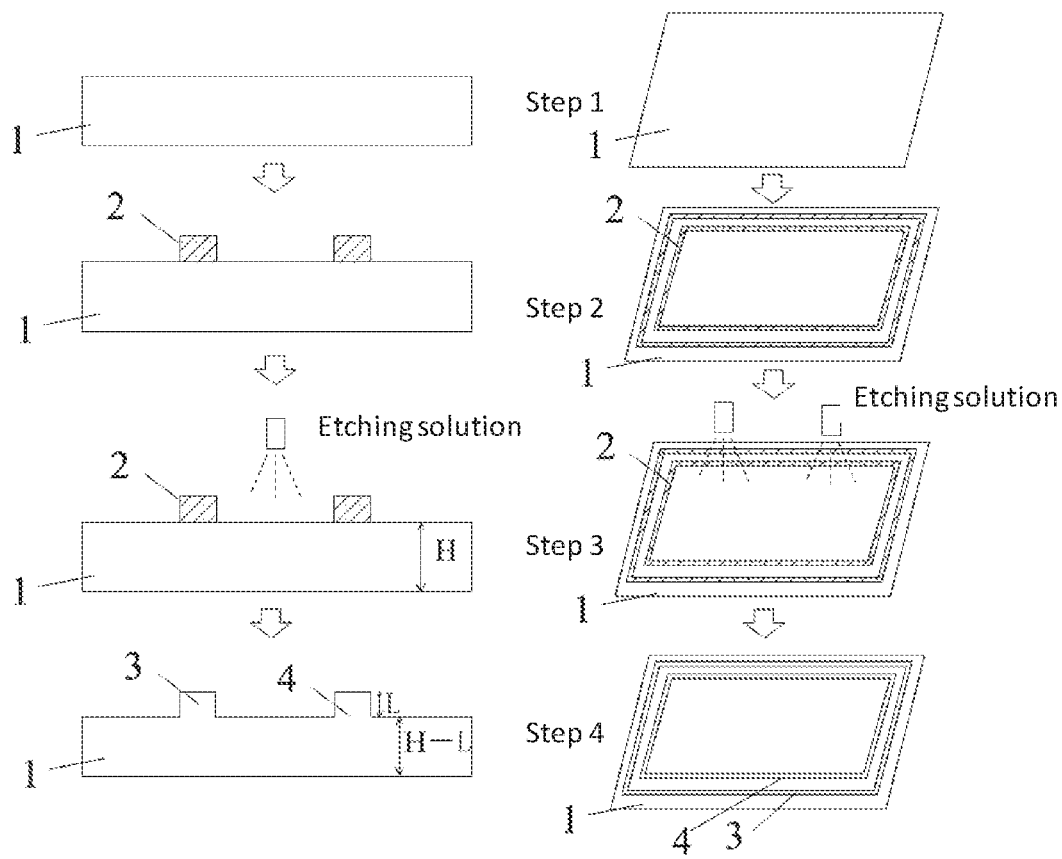
FIG. 1 is a manufacturing flow chart diagram of a method of manufacturing the color filter substrate according to a preferably embodiment of the disclosure.

Please refer to FIG. 1. FIG. 1 is a manufacturing flow chart diagram of a method of manufacturing the color filter substrate according to a preferably embodiment of the disclosure. The left side view and the right side view are respectively showing the manufacturing process from different angle. The method of manufacturing the color filter substrate comprising the following steps.

Step 1, providing a first glass substrate 1, which is providing a glass substrate on CF side.

Step 2, coating a shielding layer 2 on the first glass substrate 1.

The region of the shielding layer 2 is corresponding to a blocking wall which will be prepared; the shielding layer 2 could be sealing gel which is sealant; coating the sealing gel (which is sealant) on the first glass substrate 1 according to the shape and position of the blocking wall which will be prepared, the sealant is selective by material which will not be corroded by etching solution, the sealing region is depending on position for the needing aligning film on CF side, the aligning film could be polyimide (PI) film.

Step 3, etching the first glass substrate 1 by etching solution, and etching the first glass substrate 1 without shielded by the shielding layer 2, obtaining a blocking wall.

Using the etching solution for etching the glass substrate on CF side, the etching solution is hydrofluoric acid. The region which coated by sealing gel will blocking the etching by the hydrofluoric acid, the height of the first glass substrate 1 before etching is H.

Step 4, removing the shielding layer.

Removing sealing gel and forming blocking wall structure on the aligning film, which is a first blocking wall 3 and a second blocking wall 4. The height of the first glass substrate 1 after etching is H-L. The height of the first blocking wall 3 and the second blocking wall 4 is L.

In the preferably embodiment, the blocking wall which will be prepared includes the first blocking wall 3 and the second blocking wall 4 are respectively enclosed around the central of the first glass substrate. The first blocking wall 3 and the second blocking wall 4 are rectangular. The shielding layer 2 comprising a first shielding layer and a second shielding layer are interval positioned, which are correspondingly formed the blocking wall which comprises a first blocking wall 3 and a second blocking wall 4.

According to the method of manufacturing color filter substrate of the disclosure, it could manufacturing the color filter substrate and a display panel includes the color filter substrate of the disclosure.

Figure 2:
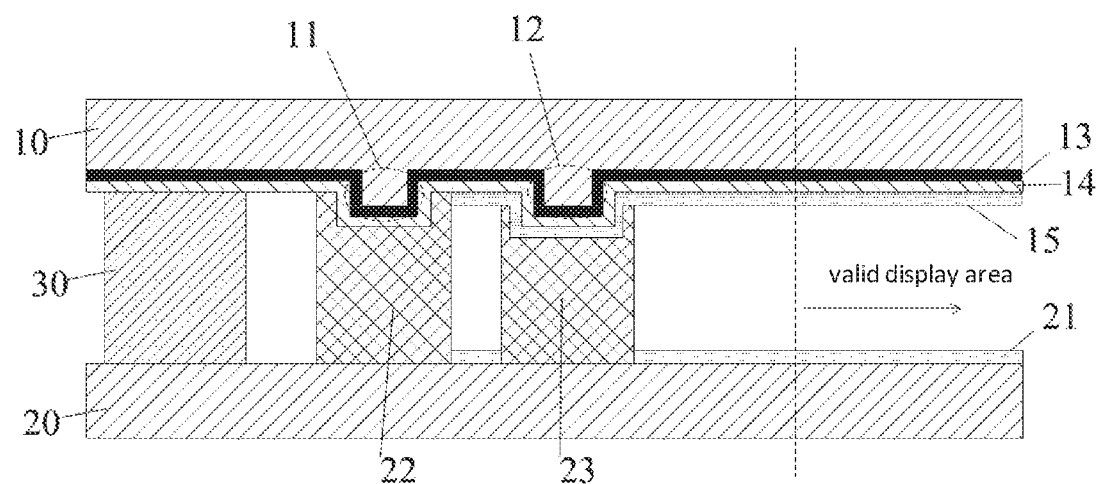
FIG. 2 is a cross-sectional schematic view of the color filter substrate according to the preferably embodiment of the disclosure.

Please refer to FIG. 2. FIG. 2 is a cross-sectional schematic view of the color filter substrate according to a preferably embodiment of the disclosure. For convince understand the disclosure, FIG. 2 further comprising relatively structures of color filter substrate and array substrate. The color substrate comprising a first glass substrate 10 (which is glass substrate on CF side) and a blocking wall formed on a surface of the first glass substrate 10 which is toward to a second glass substrate 20 (which is glass substrate on TFT side). In this preferably embodiment comprise a first blocking wall 11 and a second blocking wall 12. The first blocking wall 11 and the second blocking wall 12 are projection structures of the surface of the first glass substrate 10, and the first blocking wall 11 and the second blocking wall 12 are located in a non-display region. In this preferably embodiment, the first blocking wall 11 and the second blocking wall 12 are interval positioned, and respectively enclosed around central of the first glass substrate 10; the first blocking wall 11 and the second blocking wall 12 are rectangular. A black matrix 13, an ITO electrode 14 and an aligning film 15 are positioned on surface of the first glass substrate 10. The sealing gel 30 as sealant for packaging the first glass substrate 10 and the second glass substrate 20. An aligning film 21 is correspondingly positioned on the second glass substrate 20, and also positioned the blocking walls 22 and 23 on the aligning film which are respectively corresponding to the first blocking wall 11 and the second blocking wall 12.

Position of the first blocking wall 11 and the second blocking wall 12 of the disclosure cloud be adjusted; polyamide solution is coating between the first blocking wall 11 and the second blocking wall 12, and function of the first blocking wall 11 is preventing the polyamide solution flowing to outside of the sealing gel 30, the second blocking wall 12 is preventing the polyamide solution flowing to valid display area AA.

This disclosure is using the glass substrate on CF side to manufacture the aligning film and suitable for every LCD product which has aligning film made by injects process. In the injects process, it could control boundary of the aligning film on CF side anywhere, preventing water vapor pass in to the inner side of panel from aligning film on CF side and causes circuit corrosion, and preventing the polyamide solution flowing back lead to light leakage of panel.

Figure 3:
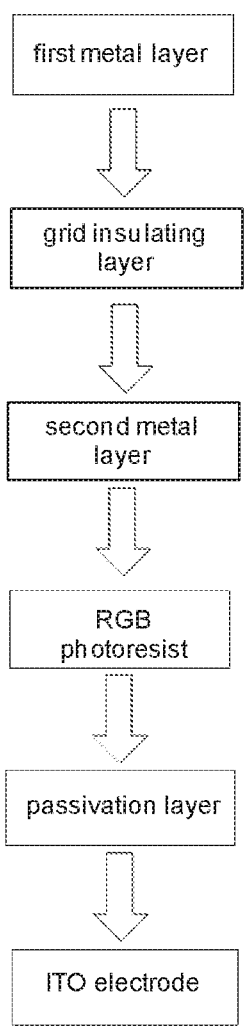
FIG. 3 is a manufacturing flow chart diagram of a LCD includes the color filter substrate according to the disclosure.
Figure 3:
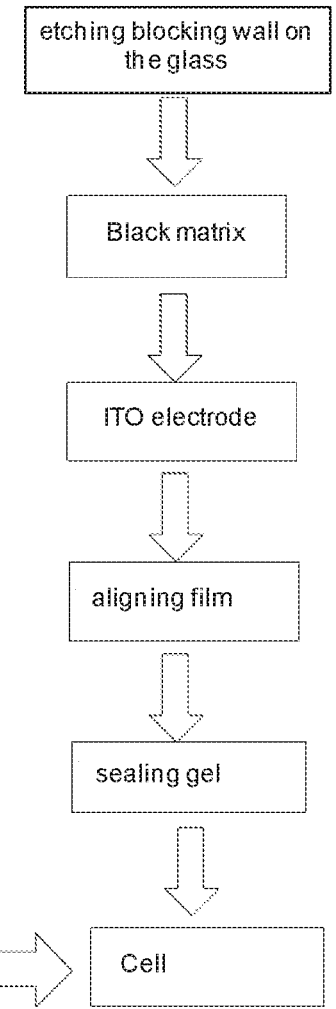

Please refer to FIG. 3. FIG. 3 is a manufacturing flow chart diagram of a LCD includes the color filter substrate according to the disclosure. According to the present invention is using the glass substrate on CF side to form blocking wall on the aligning film such that could combine with any kind of existing LCD manufacture process, only if adds a manufacturing method of the blocking wall on the aligning film on CF side. FIG. 3 describes entire manufacturing method of display panel from manufacturing of TFT substrate side (color filter on array) and manufacturing of CF substrate side (color filter on array), the display panel is using the manufacture process of color filter on array.

The manufacturing of TFT substrate side (color filter on array; COA): preparing a first metal layer (grid metal), a grid insulating layer (GI), a second metal layer (source/drain metal), RGB photoresist, a passivation layer (PV), an indium tin oxide (ITO) electrode, an aligning film (PI) by sequentially.

The manufacturing of CF substrate side (color filter on array; COA): etching blocking wall on the glass, and then preparing a black matrix (BM), indium tin oxide (ITO) electrode, an aligning film (PI) by sequentially, and coating the sealing gel.

Cell process, pasting the TFT substrate and the CF substrate together.

In sum, the color filter substrate, display panel and method of manufacturing color filter substrate of this disclosure, which using the glass substrate on CF side to be aligning film blocking wall. It could control boundary of the aligning film on CF side everywhere, and prevent water vapor pass into inside panel of the aligning film on CF side caused circuit corrosion.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A color filter substrate, comprising a first glass substrate and a blocking wall formed on a surface of the first glass substrate which is toward to an array substrate, the blocking wall is a projection structure of the surface of the first glass substrate, and the blocking wall is located in a non-display region.

2. The color filter substrate according to claim 1, wherein the blocking wall comprises a first blocking wall and a second blocking wall are interval positioned.

3. The color filter substrate according to claim 2, wherein the first blocking wall and the second blocking wall are respectively enclosed around central of the first glass substrate.

4. The color filter substrate according to claim 3, wherein the first blocking wall and the second blocking wall are rectangular.

5. A displays substrate, comprising a color filter substrate and an array substrate, the color filter substrate comprising a first glass substrate and a blocking wall formed on a surface of the first glass substrate which is toward to the array substrate, the blocking wall is a projection structure of the surface of the first glass substrate, and the blocking wall is located in a non-display region, the display panel is manufactured by color filter on the display panel.

6. A method of manufacturing color filter substrate, comprising
step 1, providing a first glass substrate;
step 2, coating a shielding layer on the first glass substrate;
step 3, etching the first glass substrate by etching solution, and etching the first glass substrate without shielded by the shielding layer, obtaining a blocking wall; and
step 4, removing the shielding layer.

7. The method of manufacturing color filter substrate according to claim 6, wherein the shielding layer is sealant.

8. The method of manufacturing color filter substrate according to claim 6, wherein the shielding layer comprising a first shielding layer and a second shielding layer are interval positioned, the blocking wall comprising a first blocking wall and a second blocking wall.

9. The method of manufacturing color filter substrate according to claim 8, wherein the first blocking wall and the second blocking wall are respectively enclosed around central of the first glass substrate.

10. The method of manufacturing color filter substrate according to claim 6, wherein etching solution is hydrofluoric acid.

* * * * *